United States Patent [19]

Knibb et al.

[11] 4,259,679
[45] Mar. 31, 1981

[54] DISPLAY DEVICES

[75] Inventors: Terence F. Knibb; Richard G. O'Rourke, both of Northampton, England

[73] Assignee: Plessey Handel und Investments A.G., Zug, Switzerland

[21] Appl. No.: 29,879

[22] Filed: Apr. 13, 1979

Related U.S. Application Data

[63] Continuation-in-part of Ser. No. 869,151, Jan. 13, 1978, abandoned.

[30] Foreign Application Priority Data

Jan. 17, 1977 [GB] United Kingdom ............... 1756/77

[51] Int. Cl.³ .................................... H01L 33/00
[52] U.S. Cl. ........................................ 357/17; 357/18; 357/81; 357/71; 362/19
[58] Field of Search .............. 357/17, 18, 71; 362/19

[56] References Cited

U.S. PATENT DOCUMENTS

| | | | |
|---|---|---|---|
| 3,964,157 | 6/1976 | Kuhn | 29/591 |
| 4,024,627 | 4/1977 | Stauffer | 29/588 |
| 4,032,963 | 6/1977 | Thome | 357/72 |
| 4,080,485 | 3/1978 | Bonkohara | 428/60 |
| 4,143,394 | 3/1979 | Schöberl | 357/72 |

*Primary Examiner*—Martin H. Edlow
*Attorney, Agent, or Firm*—Fleit & Jacobson

[57] ABSTRACT

A display device comprises a light emitting diode chip mounted on a substrate. To reduce or eliminate reflections from metallic connections to the chip, the metallic parts are electroplated with a light absorbing material.

12 Claims, 3 Drawing Figures

DISPLAY DEVICES

This application is a continuation in part of Ser. No. 869,151, Jan. 13, 1978 now abandoned.

This invention relates to display devices and more particularly to display devices incorporating light emitting diode chips.

It has been found that displays incorporating light emitting diodes suffer from reflections from the metallic connections to the diodes, particularly in very bright conditions such as aircraft cockpits, causing the displays to be difficult to read.

It is an object of the present invention therefore to reduce or overcome this problem.

According to the present invention a display device comprises a substrate, a light emitting diode chip, said light emitting diode chip being bonded to said substrate, a plurality of metallic electrical connections, a number of said plurality of metallic electrical connections being bonded to said substrate and a number being connected to said light emitting diode chip, at least some of said metallic electrical connections being electroplated with a layer of light absorbing material.

Said layer of light absorbing material may comprise substantially pure chromium electroplated in such a manner that the layer produced thereby comprises a plurality of microscopic particles of chromium said microscopic particles being formed into a sponge-like or honeycomb-like structure whereby it is non-reflective to direct light. This layer appears black to the naked eye and is hereinafter referred to as "black chromium".

Alternatively the layer of light absorbing material may comprise substantially pure platinum electroplated to form a structure similar to that described above. This layer is hereinafter referred to as "black platinum".

Embodiments of the invention will now be described by way of example only and with reference to the accompanying drawings in which.

Figure 1:
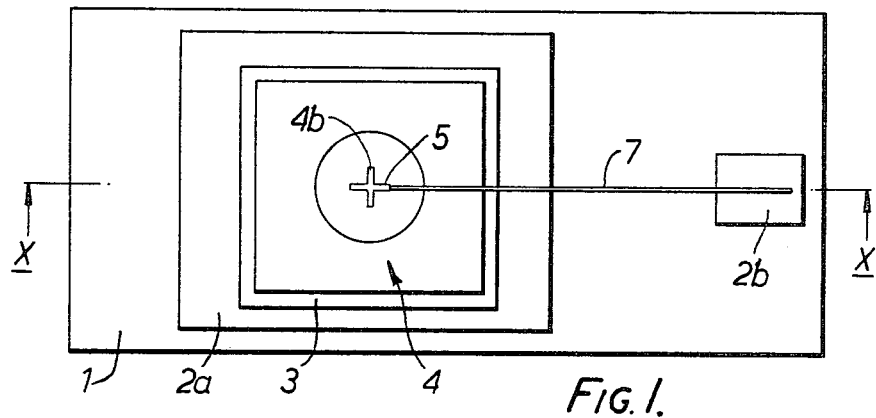
FIG. 1 illustrates in plan view a display device according to the invention.
Figure 2:
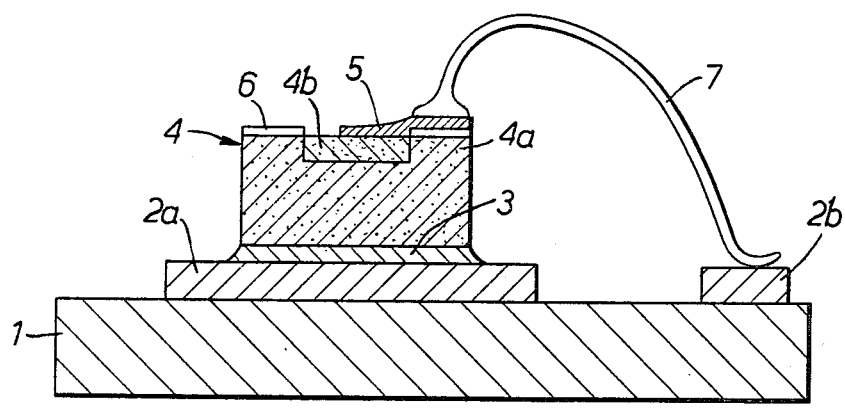
FIG. 2 illustrates in partial cross section taken along X—X the display device of FIG. 1

With reference to FIGS. 1 and 2 of the drawings, a display device according to the invention comprises a substrate 1, for example, made from ceramic, having two metal pads 2a and 2b secured to the surface of the substrate. These pads are, for example, made from gold deposited by printing a gold-bearing thick film paste on to the substrate and firing this at high temperatures (typically 1000° C.) or made by printing a non-precious metal in the above manner and subsequently electroplating with pure gold, or made by etching selectively a metal layer deposited by vacuum evaporation or sputtering and subsequently electroplating with pure gold.

Secured to the pad 2a by a conductive adhesive 3 (for example, a silver loaded epoxy resin) is a light emitting diode chip 4. The light emitting diode chip is constructed in a known manner from an N-type region of material 4a (typically gallium phosphide) and a P-type region 4b (also typically gallium phosphide). An electrode 5 is secured to the P-type region 4b but is insulated from the N-type region 4a by means of a transparent insulating layer 6, for example of silicon nitride. The electrode 5 is also made of gold or a gold rich alloy (e.g. 98% Au and 2% Zn) or aluminium or a thin layer of titanium followed by aluminium, and is connected to the pad 2b by a gold wire 7.

It will be seen that by applying a potential across the pads 2a and 2b the light emitting diode 4 will be energised and will be illuminated.

In order to improve the efficiency of the light emitting diode 4 it has been found necessary to improve the contrast between the light emanating regions of the diode 4 and the substrate 1 and the electrical connections. Thus the substrate 1 is formed from a black or dark coloured ceramic and the pads 2a, 2b the electrode 5, the wire 7 and the silver loaded epoxy resin 3 is electroplated with black chromium or black platinum. All the metal parts in this embodiment are gold or gold rich alloys and all these parts are plated with the black chromium or black platinum. However, it may not be necessary to electroplate all the metal parts, in which case these can be made from other metals. Aluminium for example, cannot be plated with black chromium or black platinum and thus the electrode 5 and the wire 7 can be made of aluminium and will not be plated. Titanium and a combination of aluminium and titanium also cannot be plated and thus those parts which need not be plated can be made from these materials. The non-metallic parts of the display device are also not plated.

The method of producing the display device consists of firstly producing the substrate 1 from a black or dark coloured ceramic, forming the connection pads 2a and 2b, for example, depositing by printing a gold bearing thick film paste on to the substrate and firing at high temperatures. The light emitting chip 4 is then bonded to a connector with an electrically conductive adhesive, such as the silver loaded epoxy resin 4, and the electrode of the light emitting diode chip 4 is electrically connected to the other connector 2b by the gold wire 7.

Where the bonding pad 2b is not electrically accessible by way of the external connections, and pad 2a is so accessible, the electrical potential on these pads is equalised by connecting these together with an aluminium or gold shorting wire (not shown). This is required since during the plating process any potential difference between these areas will result in inadequate coatings on one of the connectors.

The substrate together with all the bonding wires and the light emitting diode chip are now cleaned with a suitable solvent, for example, heated trichloroethylene, and areas not required to be plated such as certain portions of the connectors, 2a and 2b which will have external electrical connections are coated with a protective substance, such as lacquer.

The display device may at this stage be electroplated with nickel to improve the uniformity of the subsequent plating of black chromium or black platinum.

The black chromium or the black platinum is then electroplated on to the display device using a plating solution containing chromium or platinum at a current density in the range 1 to 50 mA/mm$^2$ for a period not exceeding one hour.

The protective substance is now removed by immersion in a suitable solvent such as acetone.

Finally, the aluminium or gold shorting wire is removed, where aluminium is used, this is easily distinguished since it is not plated by the black chromium or the black platinum.

Whilst a display device using only one light emitting diode chip has been described, a number of light emitting diode chips may be employed, each being secured by an electrically conductive adhesive to a metal connector. These may be connected together in series using wires connecting one metal connector to the electrode of the adjacent light emitting diode chip, or in parallel by securing all the chips to a single common metal connector and connecting all the electrodes to another single metal connector, again using wires.

If the light emitting diode chips are connected in series, then the metal connectors carrying the chips are connected together with aluminium or gold wires during the electroplating process so that the potentials of the metal connectors are maintained equal.

Figure 3:
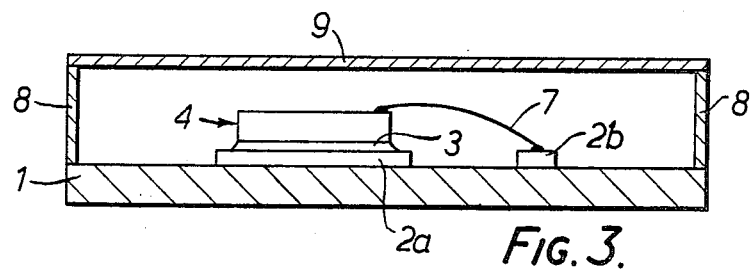
FIG. 3 illustrates in cross section a display device as shown in FIGS. 1 and 2 encapsulated by a protective layer.

The display device is protected from damage by encapsulating it as shown in FIG. 3. The encapsulation comprises wall members 8 which can be made from a suitable light absorbing material such as a black or dark coloured ceramic or epoxy resin and a transparent glass or plastic plate 9 secured to the upper edges of the wall members 8. The plate 9 may contain a circular polarizer which further reduces the amount of any light reflected from the display.

What is claimed is:

1. A display device comprising a substrate, a light emitting diode chip, said light emitting diode chip being bonded to said substrate, a plurality of metallic electrical connections, a number of said plurality of electrical connections being bonded to said substrate and a number being connected to said light emitting diode chip, at least some of said metallic electrical connections being electroplated with a layer of light absorbing material.

2. A display device as claimed in claim 1 wherein said number of said plurality of electrical connections bonded to said substrate comprises a plurality of gold connectors.

3. A display device as claimed in claim 2 wherein said light emitting diode chip is bonded to one of said plurality of gold connectors by an electrically conductive adhesive.

4. A display device as claimed in claim 3 in which said electrically conductive adhesive comprises silver loaded epoxy resin.

5. A display device as claimed in claim 1 wherein said number of said plurality of electrical connectors connected to said light emitting chip comprises at least one electrically conductive wire.

6. A display device as claimed in claim 5 wherein said at least one electrically conductive wire is gold.

7. A display device as claimed in claim 5 wherein said at least one electrically conductive wire is aluminium.

8. A display device as claimed in claim 5 wherein said at least one electrically conductive wire is a combination of aluminium and titanium.

9. A display device as claimed in claim 1 wherein said layer of light absorbing material comprises black chromium.

10. A display device as claimed in claim 1 wherein said layer of light absorbing material comprises black platinum.

11. A display device as claimed in claim 1 wherein the device is protected from damage by encapasulating means.

12. A display device as claimed in claim 11 wherein the encapsulating means comprises a transparent plate secured to light absorbing wall members.

* * * * *